United States Patent [19]
Arisaka

[11] Patent Number: 5,480,309
[45] Date of Patent: Jan. 2, 1996

[54] UNIVERSAL MULTILAYER BASE BOARD ASSEMBLY FOR INTEGRATED CIRCUITS

[75] Inventor: Hiroshi Arisaka, Tama, Japan

[73] Assignee: Kel Corporation, Tokyo, Japan

[21] Appl. No.: 248,067

[22] Filed: May 23, 1994

[51] Int. Cl.$^6$ .................................................. H01R 29/00
[52] U.S. Cl. ................................. 439/43; 439/85; 439/65
[58] Field of Search .................................. 439/43, 85, 82, 439/81, 931.1, 658

[56] References Cited

U.S. PATENT DOCUMENTS

| | | | |
|---|---|---|---|
| 3,571,923 | 3/1971 | Shaheen | 439/85 X |
| 4,095,866 | 6/1978 | Merrill | 439/85 X |
| 4,201,432 | 5/1980 | Chalmers | 439/82 OR |
| 4,526,429 | 7/1985 | Kirkman | 439/82 OR |
| 4,894,016 | 1/1990 | Wright | 439/85 X |
| 4,906,198 | 3/1990 | Cosimano et al. | 439/85 X |
| 5,102,352 | 4/1992 | Arisaka | 439/608 |
| 5,213,521 | 5/1993 | Arisaka | 439/608 |

Primary Examiner—David L. Pirlot
Assistant Examiner—Daniel Wittels
Attorney, Agent, or Firm—Robert W. J. Usher

[57] ABSTRACT

A universal laminated base board assembly for connecting an integrated circuit device to a pcb has a series of alternating, overlying, conductive and insulating layers with two of the conductive layers providing ground and current lines on respective opposite faces. A plurality of through-holes extend through the layers and insulated from the conductive layers for receiving respective socket forming body portions of contact elements selected from signal, current and grounding types with the signal contact elements remaining insulated from the conductive layers and the current and grounding types having conductive layer connecting portions bridging the insulation into connection with the current and ground layers respectively. The contact elements are inserted in those through holes which are aligned with signal, current and ground line terminal lead pins, respectively, of the particular device chosen, adapting the base board to any one of a variety of different devices. The conductive layer connecting portions may be integral with, or formed separately from, respective body portions.

6 Claims, 3 Drawing Sheets

UNIVERSAL MULTILAYER BASE BOARD ASSEMBLY FOR INTEGRATED CIRCUITS

FIELD OF INVENTION

The invention relates to an electrical connector assembly for connecting a selected one of a plurality of different electronic devices, such as integrated circuits with pin grid arrays, in which the lead pins are different positions, to a printed circuit board.

BACKGROUND OF INVENTION

Electronic devices such as integrated circuits have many lead pins arranged as pin grid arrays for the input and output of electrical signals, current(power), and for ground connection while the positions of these lead pins differ from device to device.

The installation and connection of the electronic devices on a PCB is often effected by using laminated base boards each comprising a series of conductive and insulating layers located in alternating, overlying relation between opposite faces and penetrated by through-holes receiving respective contact elements, themselves for receiving respective terminal lead pins of the respective electronic devices. Conductive layers on respective opposite faces constitute current (power) source and ground lines for connection to the current source terminal lead pins and ground source terminal lead pins, respectively, of the electronic devices which requires conductive links between edge portions of respective through-holes and the ground layer and the current source layers, respectively, while the edge portions of through-holes receiving the signal terminal lead pins must remain insulated from the conductive layers. The prior approach therefore required the manufacture of different, customized base boards for respective different electronic devices to accommodate the different positions of the terminal lead pins of the electronic devices which approach requires the manufacture and inventory of many different parts resulting in disadvantageously high applied costs.

SUMMARY OF INVENTION

An object of the invention is to provide a universal base board assembly which can accommodate any one of a variety of different electronic devices with only a single base board structure being required.

Accordingly, the invention provides an electrical connector assembly for connecting a selected one of a plurality of different electronic devices having lead pins in different positions to a printed circuit board comprising: a base board assembly having opposite, device receiving and circuit board connecting faces and comprising a series of conductive and insulating layers located in alternating, overlying relation, with one of the conductive layers providing a ground line and located on one of the opposite faces and another of the conductive layers providing a current source line and located on another of the opposite faces, a plurality of through-holes extending through the conductive and insulating layers and between the opposite faces and means insulating edge portions of respective through-holes from the conductive layers; a plurality of contact elements of first, second and third types each comprising a body portion for mounting in the base board assembly by receipt in a selected through-hole and formed with a pin receiving socket opening at one axial end thereof to the device lead pin receiving face for receiving an individual lead pin of a selected electronic device, at least contact elements of the first type each having a circuit board connecting portion at an axial end of the body portion opposite the one axial end; a contact element of the first type remaining insulated from the conductive layers when so mounted in the base board; a contact element of the second type having conductive layer connecting means which protrudes from the body portion and is brought into electrically connecting engagement with the conductive layer on one of the opposite faces when the contact element is mounted in the base board by receipt of the body portion in a respective through-hole; a contact element of the third type having conductive layer connecting means which protrudes from the body portion and is brought into electrically connecting engagement with the conductive layer on another of the opposite faces when the contact element is mounted in the base board by receipt of the body portion in a respective through-hole; and, at least some of the contact elements of the second type and at least some of the contact elements of the third type each have a circuit board connecting portion at an axial end of the body portion opposite the one axial end, the through-holes selected for receipt of respective body portions of respective contact elements of the first, second and third types being located in positions corresponding to positions of signal, current and ground terminal lead pins, respectively, of the selected electronic device.

Thus, the function of a through-hole for receipt of a current terminal lead pin or ground terminal lead pin is determined according to which type of contact element is selected so that a single base board structure can be adapted to any one of a wide variety of electronic devices having different terminal lead pin positions merely by selecting the appropriate type of contact elements and inserting it in through-holes corresponding in position to that of the corresponding type of terminal lead pin.

More particularly, at least some of the contact elements of the second type and at least some of the contact elements of the third type each have a circuit board connecting portion at an axial end of the body portion opposite the one axial end, which is usually a pin which extends axially from the body portion to protrude from the circuit board connecting face when the contact elements are mounted in the base board assembly.

In a preferred embodiment, the conductive layer connecting members comprises flange members and are formed separately from respective body portions, having respective means for attachment thereto, preferably comprising sleeve portions integrally formed with respective flange members and which can receive an axial end of the body portion as an interference fit, thereby to attach the flange member to the body portion. It is further preferred that the body portions of the contact elements of a second type and a third type are substantially identical and opposite axial ends of each identical body portion are similar so that a sleeve portion can receive either axial end of each identical body portion to form one of a contact element of a second type and a third type.

Thus, the circuit board connecting pins and body portions can be manufactured separately and assembled subsequently according to the respective type of contact elements desired, while all conductive layer connecting portions and all body portions can be identical, requiring the manufacture of only two different parts of relatively simple structures, resulting in a simplification in mass production and consequential cost saving.

BRIEF DESCRIPTION OF THE DRAWINGS

Specific embodiments of the invention will now be described by way of example only and with reference to the accompanying drawings in which.

DESCRIPTION OF PARTICULAR EMBODIMENT

Figure 1:
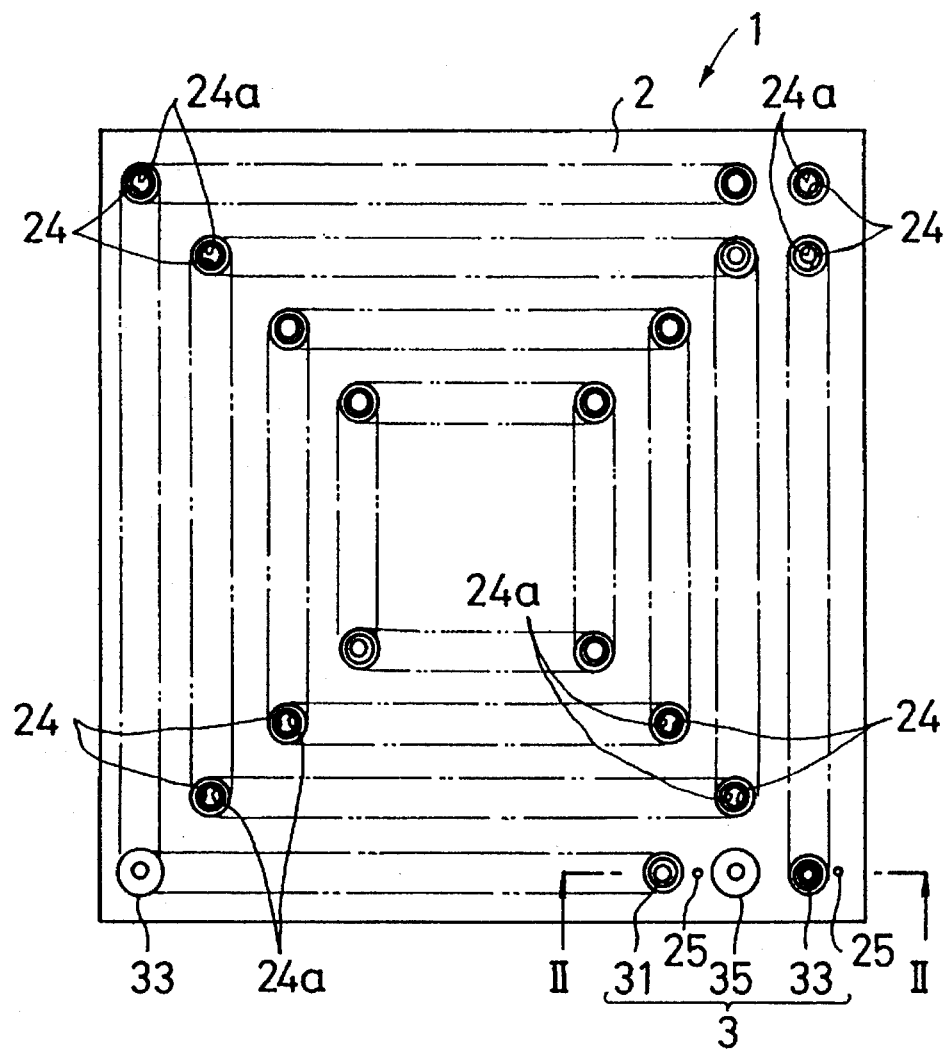
FIGS. 1A and 1B are diagrammatic plan and elevational views, respectively, of an electrical connector assembly according to a first embodiment of the invention.
Figure 1:
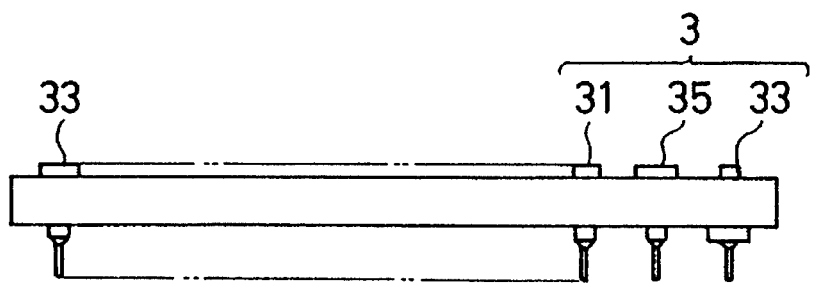
Figure 2:
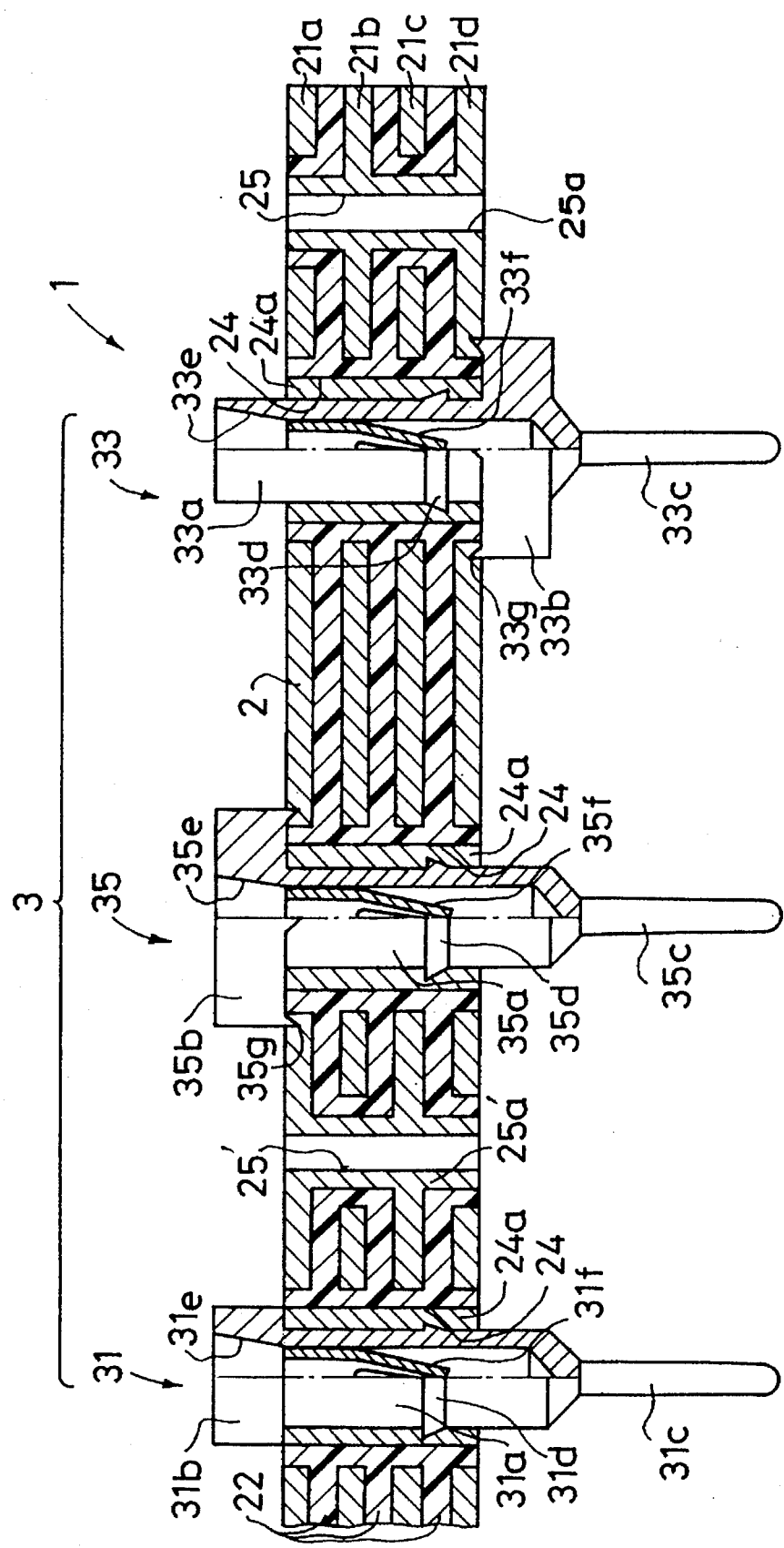
FIGS. 2 is a cross-sectional view taken along line II—II of FIG. 1A.

As shown in FIGS. 1A, 1B and 2, the electrical connector assembly 1 is suitable for connecting any selected one of a variety of different electronic devices with different pin grid arrays such as integrated circuits to a pcb and comprises a laminated base board or base plate 2 and a plurality of contact elements 2 for mounting thereon in positions corresponding to the terminal lead pins of the particular integrated circuit selected.

The base board comprises a series of conductive and insulating layers 21a, 21b, 21c and 21d, and 22, respectively, laminated in alternating, overlying relation with the insulating layers 22 sandwiched between respective conductive layers 21a, 21b, 21c and 21d. A plurality of rows of main through-holes 24 forming a grid or matrix like array, extend through the conductive and insulating layers and between the opposite faces and are metalized with conductive portions 24a on respective edge portions which are insulated from respective conductive layers 21a–d. Subsidiary through-holes 25, 25' also extend through all layers and between opposite faces and are also metalized with conductive portions 25a and 25a', respectively, on respective edge portions and electrically interconnect a second conductive layer 21b to a fourth conductive layer 21d, and a first conductive layer 21a to a third conductive layer 21c, respectively. One of the pairs 21a and 21c, and 21b and 21b of interconnected conductive layers forms a current source layer which is part of a current source line, and the other pair forms a ground layer which is part of a ground source line. Obviously the functions of the pairs of conductive layers is interchangeable when an alternating current is applied.

As shown in FIG. 2, the contact elements 31, 33 and 35 are of three types.

Each contact elements 31 of the first type has a one-piece cylindrically tubular body portion 31a, an integral, annular flange 31b which extends radially outward from an upper axial end of the body portion, an integral circuit board connecting pins 31c which extends axially downward from a lower axial end of the body portion and an integral, radially outwardly extending, annular anchoring tang or barb 31d on the body portion at a medial location thereof which flares outwardly and upwardly to permit forcible insertion of the body portion into the through-hole from an upper face of the base board but which resists extraction. A separate sleeve-form member with a resilient contact finger 31f for gripping the signal terminal lead pin of an electronic device is seated in the socket formed by the body portion.

The contact elements 31 of the first type are forcibly inserted via the upper face into the respective through-holes 24 which are aligned with the signal terminal lead pins of the selected electronic device so that the sockets open to the upper or device lead pin receiving face and the circuit board connecting pins protrude downward from the opposite lower circuit board connecting face.

Each contact element 33 of the second type has a one-piece cylindrically tubular body portion 33a, an integral, annular flange 33b which extends radially outward from a lower axial end of the body portion and has a ring of upwardly directed ground circuit layer connecting teeth 33g, an integral circuit board connecting pins 33c which extends axially downwards from the lower axial end of the body portion and an integral, radially outwardly extending, annular anchoring tang or barb 33d on the body portion at a medial location thereof which flares outwardly and downward to permit forcible insertion of the body portion into the through-hole from a lower face of the base board but which resists extraction. A separate sleeve-form member with a resilient contact finger 33f for gripping the ground terminal lead pin of an electronic device is seated in the socket formed by the body portion. The ground layer connecting teeth 33g may be formed as four separate teeth or as a substantially continuous sawtooth ring structure.

The contact elements 33 of the second type are forcibly inserted via the lower face into the resp through-holes 24 which are aligned with the ground terminal lead pins of the selected electronic device so that the sockets open to the upper or device lead pin receiving face and the circuit board connecting pins protrude downward therefrom. The ground circuit connecting layer connecting tooth 33g bites into the lowermost, fourth ground layer 21d which is electrically connected to the second ground layer 21b.

Each contact elements 35 of the third type has a one-piece cylindrically tubular body portion 35a, an integral, annular flange 35b which extends radially outward from an upper axial end of the body portion and has a ring of four downward directed current source connecting layer connecting teeth 35g, an integral circuit board connecting pins 35c which extends axially downwards from the opposite, lower axial end of the body portion and an integral, radially outwardly extending, annular anchoring tang or barb 35d on the body portion at a medial location thereof which flares outwardly and upwards to permit forcible insertion of the body portion into the through-hole from a lower face of the base board but which resists extraction. A separate sleeve-form member with a resilient contact finger 35f for gripping the ground terminal lead pin of an electronic device is seated in the socket formed by the body portion.

The contact elements 35 of the third type are forcibly inserted via the lower face into the resp through-holes 24 which are aligned with the current terminal lead pins of the selected electronic device so that the sockets open to the upper or device lead pin receiving face and the circuit board connecting pins protrude from the opposite lower circuit board connecting face.

The current source connecting layer connecting teeth 35g bite into the uppermost, first current source connecting layer 21a which is electrically connected to the third current source connecting layer.

Thus, the insertion of appropriate contact elements in selected through-holes provides a base board assembly of universal type.

When the base board assembly is installed on a pcb, the circuit board connecting pins 33c and 35c, of the second and third types of contact elements, respectively, are soldered to the ground and current source conductive paths while the circuit board connecting pins 31c of the contact elements of the first type are soldered to the signal paths of the pcb.

The laminated structure of the conductive layers enables them to provide electrical shielding, suppressing cross-talk among contact elements 31, 33 and 35. Furthermore, as the conductive layers which form the ground layer surround the contact 31 of the first signal type, they shield the signal contact elements from external noise. In addition, as the second and forth conductive layers 21b and 21d, respectively, are directly connected to the second contact type 33 and the first and third conductive layers 21a and 21c, respectively, are directly connected to the second contact type 33, the impedance of the current source system which includes these parts can be reduced.

Figure 3:
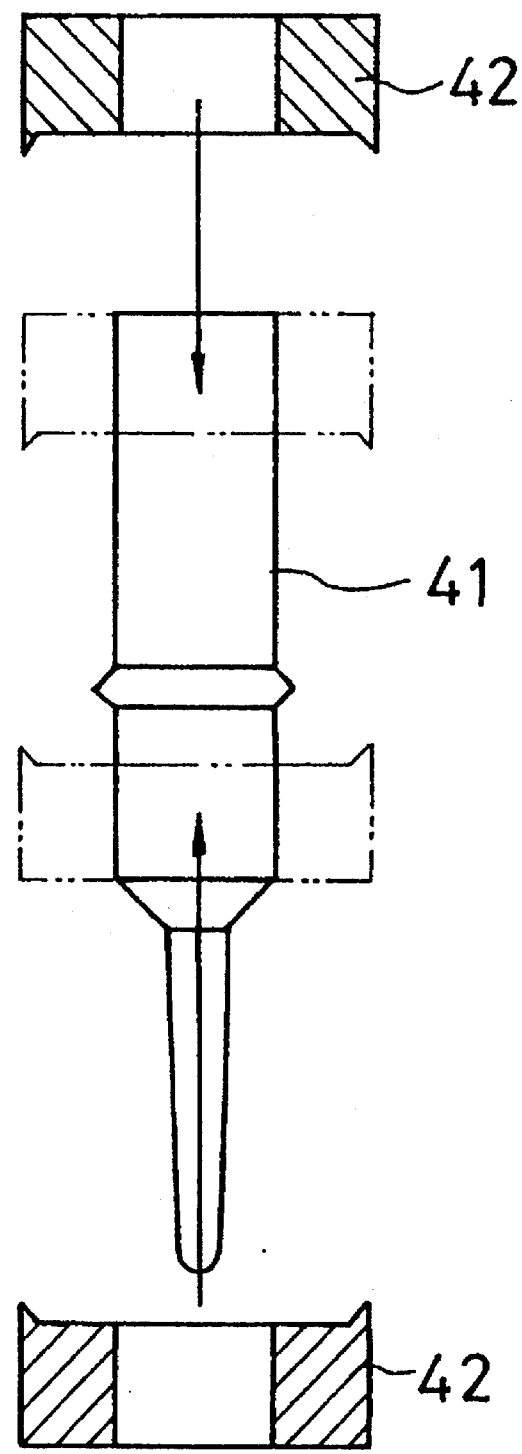
FIG. 3 is an elevational view, partly in cross-section, of a contact elements according to a second embodiment of the invention.

In the second embodiment shown in FIG. 3, in contrast to the first embodiment where the contact elements body part, circuit board connecting pins and conductive layer connecting flange parts were made in one piece of metal, the body portion 41 and the conductive layer connecting means 42 are formed separately, enabling common body parts to be used for all types of contact elements while the symmetry of the body portion enables the circuit board connecting pins to be received on either of the opposite axial ends as a force fit enabling the contact element of either type to be assembled from identical body portions and circuit board connecting pins.

I claim:

1. An electrical connector assembly for connecting a selected one of a plurality of different electronic devices having lead pins in different positions to a printed circuit board comprising:

a base board assembly having opposite, device connecting and circuit board connecting faces and comprising a series of conductive and insulating layers located in alternating, overlying relation, with one of the conductive layers providing a ground line and located on one of the opposite faces and another of the conductive layers providing a current source line and located on another of the opposite faces, a plurality of through-holes extending through the conductive and insulating layers and between the opposite faces and means insulating edge portions of respective through-holes from the conductive layers;

a plurality of contact elements of first, second and third types each comprising a body portion for mounting in the base board assembly by receipt in a selected through-hole and formed with a pin receiving socket opening at one axial end thereof to the device connecting face for receiving an individual lead pin of a selected electronic device, at least contact elements of the first type each having a circuit board connecting portion at an axial end of the body portion opposite the one axial end;

a contact element of the first type remaining insulated from the conductive layers when so mounted in the base board;

a contact element of the second type having conductive layer connecting means which protrudes from the body portion and is brought into electrically connecting engagement with the conductive layer on one of the opposite faces when the contact element is mounted in the base board by receipt of the body portion in a respective through-hole;

a contact element of the third type having conductive layer connecting means which protrudes from the body portion and is brought into electrically connecting engagement with the conductive layer on another of the opposite faces when the contact element is mounted in the base board by receipt of the body portion in a respective through-hole; and, at least some of the contact elements of the second type and at least some of the contact elements of the third type each have a circuit board connecting portion at an axial end of the body portion opposite the one axial end, the through-holes selected for receipt of respective body portions of respective contact elements of the first, second and third types being located in positions corresponding to positions of signal, current and ground circuits, respectively, of the selected electronic device.

2. An electrical connector assembly according to claim 1 wherein at least some of the circuit board connecting portions comprise pins which extend axially from respective body portions to protrude from the circuit board connecting face when the contact elements are mounted in the base board assembly.

3. An electrical connector assembly according to claim 1 wherein the conductive layer connecting members comprises flange members on respective body portions.

4. An electrical connector assembly according to claim 3 wherein the conductive layer connecting members are formed separately from respective body portions and have respective means for attachment thereto.

5. An electrical connector assembly according to claim 4 wherein each attachment means comprises a sleeve portion integrally formed with the flange member and which can receive an axial end of the body portion as an interference fit, thereby to attach the flange member to the body portion.

6. An electrical connector assembly according to claim 5 wherein the body portions of at least some of the contact elements of a second type and a third type are substantially identical and opposite axial ends of each identical body portion are similar so that a sleeve portion can receive either axial end of each identical body portion to form one of a contact element of a second type and a third type.

* * * * *